United States Patent [19]

Baumgartner et al.

[11] Patent Number: 5,432,438
[45] Date of Patent: Jul. 11, 1995

[54] COMBINED CURRENT AND VOLTAGE TRANSFORMER FOR A METAL-ENCLOSED GAS-INSULATED HIGH-VOLTAGE SWITCHING STATION

[75] Inventors: Rudolf Baumgartner, Gebenstorf; Ken Y. Haffner, Baden; Andrzej Kaczowski, Würenlingen, all of Switzerland

[73] Assignee: Asea Brown Boverti Ltd., Switzerland

[21] Appl. No.: 904,863

[22] Filed: Jun. 26, 1992

[30] Foreign Application Priority Data

Jun. 29, 1991 [DE] Germany .............. 41 21 654.7

[51] Int. Cl.⁶ .............. G01R 19/00; G08B 21/00
[52] U.S. Cl. .............. 324/127; 364/483; 364/492; 340/657; 340/870.17
[58] Field of Search .............. 324/127, 142, 17; 336/84 C; 340/538, 657, 539, 870.38, 870.17; 364/464, 492, 483

[56] References Cited

U.S. PATENT DOCUMENTS

| 3,621,392 | 11/1971 | Liebermann et al. | 324/142 |
| 3,731,190 | 5/1973 | Schwendtner | 324/142 |
| 4,758,962 | 6/1988 | Fernandes | 324/127 |

FOREIGN PATENT DOCUMENTS

| 2325441 | 11/1974 | Germany . |
| 2656817 | 6/1978 | Germany . |
| 2833036 | 1/1980 | Germany . |
| 2930672 | 7/1985 | Germany . |
| 3544508 | 8/1986 | Germany . |
| 3712190 | 10/1988 | Germany . |
| 583909 | 1/1977 | Switzerland . |
| 633085 | 11/1978 | U.S.S.R. . |
| 842999 | 6/1981 | U.S.S.R. . |
| 980638 | 12/1982 | U.S.S.R. . |
| 1078479 | 7/1984 | U.S.S.R. . |

OTHER PUBLICATIONS

Keitel, J.; u.s.: Strommessung mittels Rogowski-Spule. In: Elektrie 33, 1979, H.5, S.251-253.

Primary Examiner—Kenneth A. Wieder
Assistant Examiner—Barry C. Bowser
Attorney, Agent, or Firm—Ostrolenk, Faber, Gerb & Soffen

[57] ABSTRACT

A combined current and voltage transformer for a metal-enclosed, gas-insulated high-voltage switching station. It has a current and voltage sensor (10) and a signal processing device connected following the current and voltage sensor (10). A coil (14) wound in the shape of a torus serves as current sensor, and a hollow cylindrical test electrode (15) serves as voltage sensor. After installation of the current and voltage sensor (10) in the metal enclosure (4), the coil (14) and test electrode (15) concentrically surround a conductor (5) of the switching station. This combined current and voltage transformer is cost effective in production, has small dimensions, and a high measurement accuracy. This is achieved when the current and voltage sensors are constructed such that signals corresponding to the temporal variation in the current to be determined and in the voltage to be determined are present at their outputs, and the signal processing device has at least one integration device on which the output signals of the current and voltage sensors (10) act.

10 Claims, 3 Drawing Sheets

COMBINED CURRENT AND VOLTAGE TRANSFORMER FOR A METAL-ENCLOSED GAS-INSULATED HIGH-VOLTAGE SWITCHING STATION

BACKGROUND OF THE INVENTION

1. Field of the Invention

The invention proceeds from a combined current and voltage transformer for a metal-enclosed, gas-insulated high-voltage switching station, having a current sensor and a voltage sensor and a signal processing unit connected following the current and voltage sensor, in which the current sensor contains a coil wound in the shape of a torus and the voltage sensor contains a hollow cylindrical test electrode, and in which after installation in the metal enclosure the coil and test electrode concentrically surround a conductor of the switching station.

2. Discussion of Background

In this case, the invention refers to a prior art such as follows, for example, from DE-A1-2,325,441. A measuring transducer represented in FIG. 1 of this patent publication and intended for installation in a metal-enclosed, gas-insulated switching station contains a metal tube, fastened in an electrically insulated fashion to a mounting lug, as well as current transformer coils having mounted secondary windings. The metal tube and the current transformer coils supported by it and having the mounted secondary windings are arranged coaxially with a conductor of the switching station in the interior of the metal enclosure. The metal tube forms with the conductor the upper voltage capacitor of a capacitive divider at whose output a signal is present which corresponds to the voltage applied at the conductor. Signals which correspond to the current flowing in the conductor can be tapped at the secondary windings. The current transformer cores have large dimensions and contain, moreover, predominantly specifically heavy, ferromagnetic material. Consequently, the combined current and voltage transformer according to the prior art not only demands a lot of space, but because of its high weight requires a particularly sturdy and stable construction. In order to achieve good measurement accuracy, the capacitive divider requires, moreover, a lower voltage capacitor that is thermally stable.

SUMMARY OF THE INVENTION

The object of this invention, as the latter is specified in patent claim 1, is to provide a combined current and voltage transformer for metal-enclosed, gas-insulated high-voltage switching stations, which is cost effective in production, has small dimensions, and yet is typified by a high measurement accuracy.

The combined current and voltage transformer according to the invention is typified in that by comparison with the diameter of the metal enclosure it has a current and voltage sensor of negligibly small dimensions, which can be installed in the interior of the enclosure virtually at any desired location without substantially impairing the insulation spacing. The combined current and voltage transformer according to the invention is typified, moreover, by high measurement accuracy. The reason for this is that a lower voltage capacitor is used whose requirements with regard to stability in the long term and under heat are, in common with its requirements in respect of low inductance and losses, small, and that the output signals of the current and voltage sensors can be particularly favorably evaluated in similarly constructed integrating devices or in an integration device driven in multiplex mode. Moreover, a change in the dielectric constant of the insulation of the current and voltage sensors, and instability in the cable capacitance which is always present between the current and voltage sensor and signal processing device now no longer have any influence on the measurement accuracy of the current and voltage transformer according to the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, which represent an exemplary embodiment, and wherein.

DESCRIPTION OF THE PREFERRED EMBODIMENTS

Figure 1:
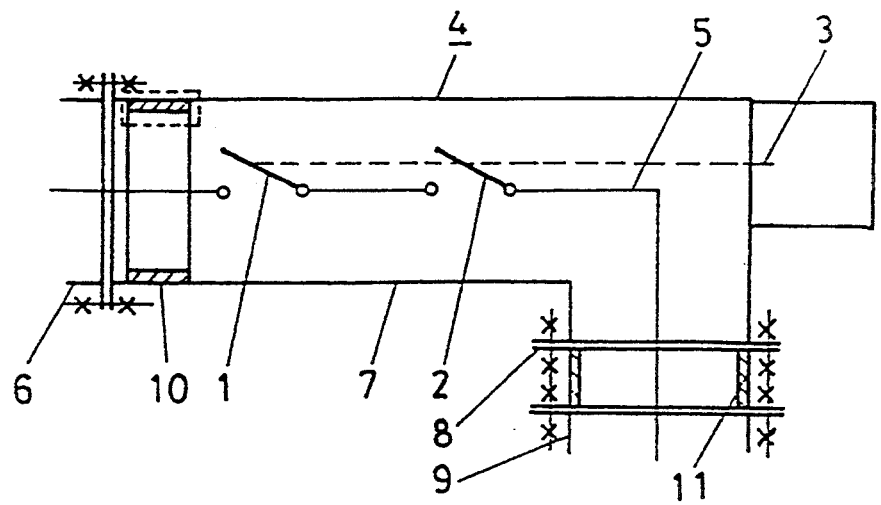
FIG. 1 shows a top view of a centrally taken section through a part of a metal-enclosed, gas-insulated high-voltage switching station having current and voltage sensors of combined current and voltage transformers according to the invention.

Referring now to the drawings, wherein like reference numerals designate identical or corresponding parts throughout the several views, FIG. 1 represents a part, containing a circuit-breaker having switching points 1, 2 and a drive 3, of a metal-enclosed, gas-insulated high-voltage switching station. In this case, the tubular metal enclosure, which is at ground potential and designated by the reference numeral 4, is filled with an insulating gas such as, in particular, $SF_6$, at a pressure of a few bars. A conductor 5 is arranged in the interior of the metal enclosure 4 extending along the tubular axis thereof. This conductor is supported on insulators (not represented), which are flanged in between enclosure segments 6, 7 or 7, 8 or 8, 9 and preferably effect a compartmentalization of the insulating gas. Current and voltage sensors 10, 11 of combined current and voltage transformers are provided in the interior of the metal enclosure 4. These sensors surround the conductor 5 concentrically and have the same axis as the parts of the metal enclosure 4 which hold them, that is to say as a part of the enclosure segment 7 or as the enclosure segment 8. If the metal enclosure 4 contains more than one conductor, the current and voltage sensors then surround the assigned conductor concentrically but then do not have the same axis as the metal enclosure.

By comparison with the diameter of the tubular metal enclosure 4, the current and voltage sensors 10, 11 integrated in support bodies (not specially emphasized) have only a small dimension transverse to the tube axis. Consequently, the sensors such as, for example, the current and voltage sensor 10, can be inserted in the metal enclosure 4 virtually at any desired location without substantially impairing the insulation spacing, and fixed by suitable measures such as, for example, by clamping or screwing. As represented in the case of the current and voltage sensor 11, however, it is also possible to install the support body between two flanges of the metal enclosure 4 and fix it gas-tight by means of screws. In this case —as can be seen from FIG. 1—the fixed support body can be integrated in an enclosure segment. If necessary, however, an insulator which supports the conductor 5 and is fastened between two flanges can be used to hold the sensors.

Figure 2:
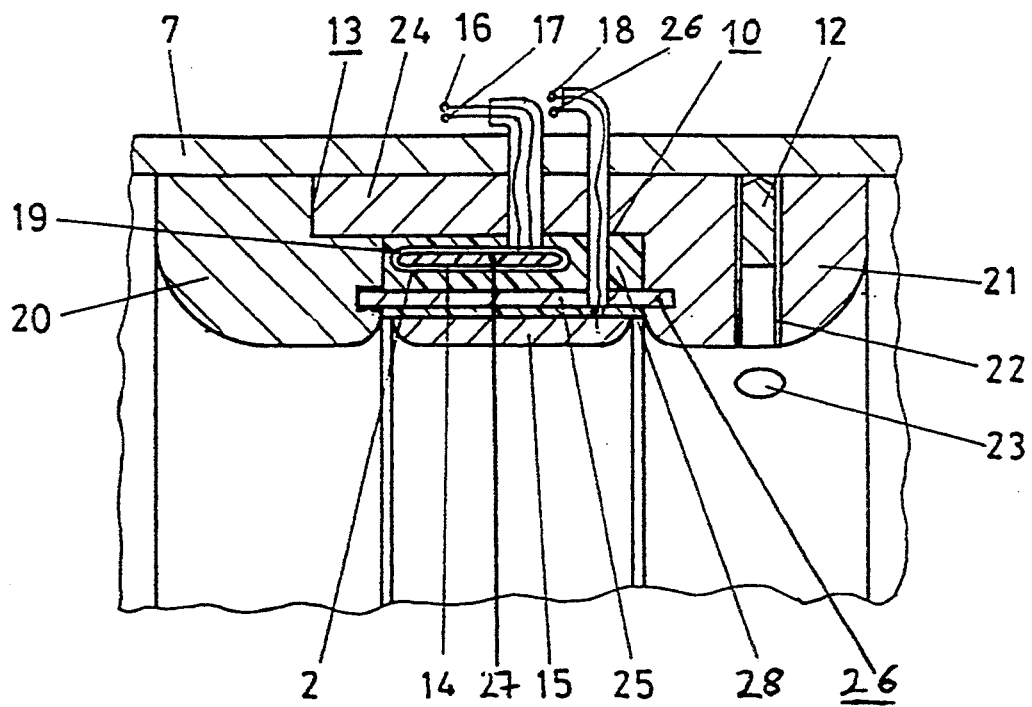
FIG. 2 shows a top view of a part, marked by encirclement, of a current and voltage sensor according to FIG. 1.

The structure and arrangement of the current and voltage sensor 10 can be seen in FIG. 2. The part, represented enlarged in this figure, of the current and voltage sensor 10 essentially includes an annular support body 13 clamped in the metal enclosure—for example by screws 12 led radially outwards against the enclosure part 7—an annular coil 14 wound in the shape of a torus, a hollow cylindrical test electrode 15, and shielded signal lines 16, 17 and 18 led out in a gas-tight fashion from the metal enclosure 4 to the signal processing device (not represented).

The support body 13 contains a chamber 19, which annularly surrounds the conductor 5 and in which the coil 14 is arranged. The chamber 19 is bounded at its two end faces by two shielding electrodes 20, 21 which surround the conductor 5 in the form of a bulge. The shielding electrode 21 has sealable bores 22, 23 for accommodating the screws 12, as well as an annular attachment 24, which rests on the inner surface of the enclosure part 7 and is fitted into the shielding electrode 20 to form the support body 13. The attachment 24 bounds the annular chamber 19 on its circumferential surface facing the metal enclosure, whereas the chamber 19 is bounded on its circumferential surface facing the conductor 5 by a planar, annular shielding electrode 25. One end face of the shielding electrode 25 is held in an electrically conductive fashion on the shielding electrode 21, and its opposite end face is held in an electrically insulating fashion on the shielding electrode 20. The shielding electrodes 20, 21 and 25 forming a shield 26 preferably consist of the same material as the metal enclosure, for example of aluminum, and are at the same electrical potential as the metal enclosure 4. The shield 26 protects the chamber 19 against the influence of electrical interference fields. Consequently, virtually error-free signals are transmitted by the coil 14 during measurement in the station under operational conditions.

The coil 14 is wound in the manner of a Rogowski coil onto an annular core 27 made from non-ferromagnetic, predominantly isotropic material. In axial section, the coil 27 has an essentially rectangular cross section and is only of very small dimension by comparison with its radius and with its axial extent in the radial direction. It has a typical thickness of only 5 mm in conjunction with a radius of, for example, 140 mm and an axial longitudinal extent of, for example, 100 mm. As a result, asymmetries in the magnetic field of the current to be measured are compensated, and the influence of undesired stray fields is minimized at the same time. The chamber 19 accommodating the coil 14 is filled by an annular insulating body 28, by means of which the coil 14 on the support body 13 and, at the same time, the shielding electrode 25 and the test electrode 15 are fixed.

Figure 3:
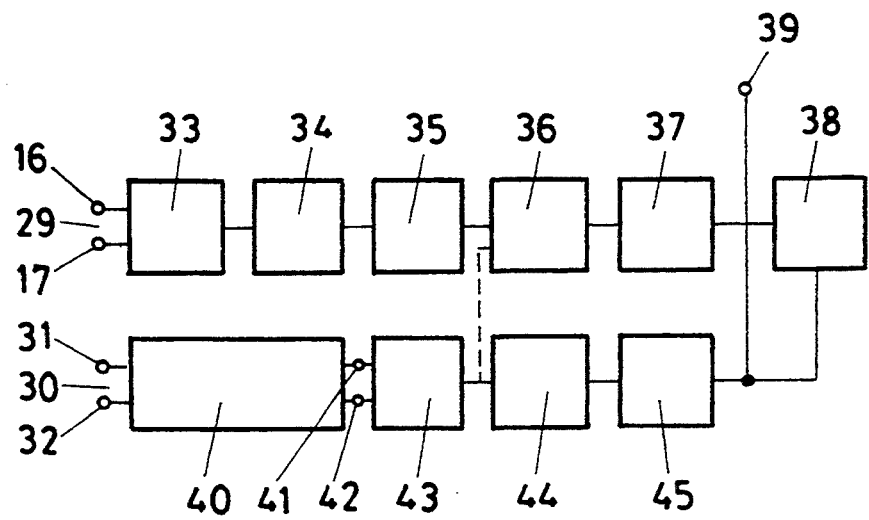
FIG. 3 shows a block diagram of a signal processing device connected downstream of a current and voltage sensor in accordance with FIGS. 1 and 2.

The signal processing device represented in FIG. 3 as a block diagram has two inputs 29, 30. The output signals of the part of the current and voltage sensor 10 acting as current sensor are fed to the input 29 via the signal lines 16, 17. The output signals of the part of the current and voltage sensor 10 acting as voltage sensor are fed to the input 30 via signal lines 31 and 32.

The coil 14, which is constructed in the manner of a Rogowski coil, supplies signals which are proportional to the temporal variation of the current flowing in the conductor 5 and which because of the suitably arranged shield 26 are virtually free from the influences of undesired stray fields and from transient processes occurring in the station. These signals act via an overvoltage protection 33 and a bandpass filter 34, which when the station is operating with AC voltages of 50 Hz typically has a bandpass between 0.05 Hz and 5 kHz, on the input of an analog-to-digital converter 35 which in terms of its dynamic operating range is matched to the bandpass filter 34. The signals digitized in the analog-to-digital converter 35 are subsequently integrated in an integration device 36, which is preferably constructed as a digital IIR filter, to form a signal corresponding to the current to be determined. This signal can then optionally be converted for an analog display 38 via a downstream digital-to-analog converter 37, and/or be handed on for further processing to other functional units 39 of the station.

Signals proportional to the temporal variation in the high voltage applied at the conductor 5 are fed to the input 30. These signals act via a protection and filter element 40 and signal lines 41, 42 on an analog-to-digital converter 43 constructed to correspond to the analog-to-digital converter 35. The signals digitized in the analog-to-digital converter 43 are subsequently integrated in an integration device 44, which is preferably constructed as a digital IIR filter, to form a signal corresponding to the voltage to be determined. This signal can then be optionally converted for the analog display 38 via a downstream digital-to-analog converter 45, and/or be handed on for further processing to the other functional units 39 of the station. As represented by a dashed line, the signals output by the analog-to-digital converter 43 can also be processed in the integration device 36. All that is required for this purpose is for this integration device to be used in multiplex mode to feed the output signals of the analog-to-digital converters 35 and 43 in a temporally interleaved fashion to the input of the integration device 36.

Figure 4:
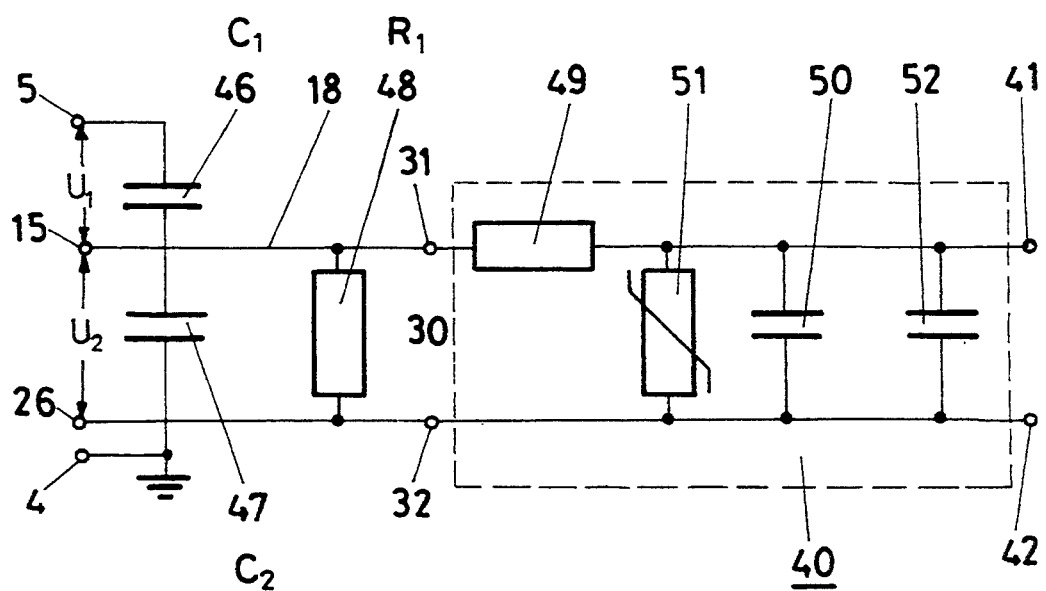
FIG. 4 shows a schematic diagram, represented in part as an equivalent circuit diagram, of the part, designed as a voltage sensor, of the current and voltage sensor according to FIG. 2 and of a part of the signal processing device in accordance with FIG. 3.

FIG. 4 shows how the signals corresponding to the temporal variation in the high voltage applied at the conductor 5 can be generated. Clearly, after the installation of the current and voltage sensor 10 in the station, the test electrode 15 forms with the conductor 5 a coupling capacitor for the electric field emanating from the conductor 5 and corresponding to the applied high voltage, and with the shield 26 and the metal enclosure 4 an auxiliary capacitor which improves the processing and accuracy of the coupled-in measuring signal. The coupling capacitor and auxiliary capacitor have capacitance values $C_1$ and $C_2$ and correspond to the high-voltage capacitor 46 and the low-voltage capacitor 47 of a capacitive voltage divider, into the high-voltage capacitor 46 of which a voltage $U_1$ corresponding to the station voltage is coupled, and into the low-voltage capacitor 47 of which a voltage $U_2$ converted in accordance with the divider ratio is coupled. Typical values for $C_1$ and $C_2$ are, for example, a few pF and a few nF. In order to achieve a voltage $U_2$ of high accuracy, a low-voltage capacitor 47 is required which has particularly low inductance and losses and is stable in the long term and under heat. Such a capacitor is extremely expensive. The use of an expensive capacitor can, however, be avoided when signals proportional to the temporal variation in the high voltage applied at the conductor 5 are formed in the current and voltage sensor. It is simultaneously achieved by this measure that the current sensor and voltage sensor respectively output signals which correspond to the temporal variations in variables to be measured (first derivative of current or voltage with respect to time) and can therefore be processed in a particularly simple and reliable fashion by similarly acting integration devices.

Signals proportional to the temporal variation in the high voltage applied at the conductor 5 can, as is clear from FIG. 4, be obtained in a particularly simple way when the part of the current and voltage sensor 10 acting as voltage sensor has an ohmic resistor 48, one end of which is connected in an electrically conductive fashion to the test electrode 15 and the other end of which is connected in an electrically conductive fashion to the metal enclosure 4 and the shield 26. The voltage signals dropping across the resistor 48 and fed via the signal lines 31, 32 of the signal processing device represented in FIG. 3 correspond to a good approximation to the temporal variation in the high voltage applied at the conductor 5.

The low-voltage capacitor with the capacitance value $C_2$ has to fulfill the following function when the voltage sensor is constructed with the ohmic resistor 48:

It limits high-frequency interference signals occurring in the metal enclosure 4 as a consequence of transient processes, such as switching operations or lightning impulses. At the same time, it reduces the voltage which occurs at the output of the voltage sensor and is handed on by the signal lines 31, 32 to the signal processing device.

Figure 5:
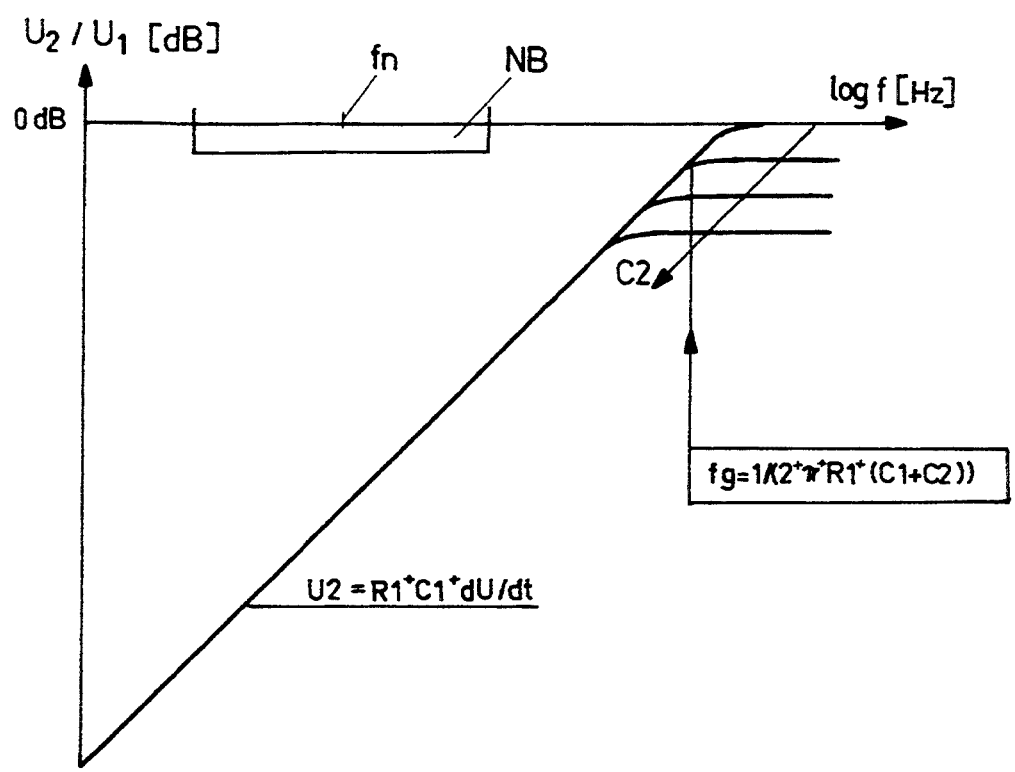
FIG. 5 shows a graphical representation of the transfer function of the measuring signal of the voltage sensor in accordance with FIG. 4.

The abovementioned effect of the voltage sensor is achieved when the high-voltage capacitor 46 formed by the conductor 5 and the test electrode 15, the low-voltage capacitor 47 formed by the test electrode 15 and the metal enclosure 4 as well as the shield 26 of the current sensor, and the ohmic resistor 48 are dimensioned such that above a prescribed threshold frequency $f_g$ the amplitudes of the signals output by the voltage sensor are below a prescribed amplitude limiting value. This is illustrated in FIG. 5, in which the transfer function of the voltage sensor, which is determined by the ratio of the voltage $U_1$ applied at the voltage sensor to the voltage $U_2$ output by the voltage sensor is represented as a function of the frequency f. Clearly, the threshold frequency is determined by the following relationship:

$f_g = \frac{1}{2}\pi R_1(C_1+C_2)$, where $f_g$ signifies the threshold frequency in hertz,
$R_1$ signifies the value of the ohmic resistor 48 in ohms, and
$C_1$ and $C_2$ signify the values of the high-voltage and low-voltage capacitors 46, 47 in farads.

In this case, the threshold frequency $f_g$ is designed such that a useful band NB required for a distortion-free transfer function of the voltage sensor is available about the line frequency of the station voltage of for example 50 Hz marked by the designation $f_n$.

The voltage signals occurring at the output of the voltage sensor and fed to the input 30 of the signal monitoring device are still further limited in the protection and filter element 40. The protection and filter element 40 contains a filter element, constructed as a low-pass filter, and an overvoltage protection. The low-pass filter is constructed as an RC element having an ohmic resistor 49 and a capacitor 50. A nonlinear resistor 51, based on metal oxide, for example, which is connected to the tie point of resistor 49 and capacitor 50, is connected in parallel to the capacitor 50 of the RC element. The capacitance of the signal lines, which cannot be avoided, is designated by the designation 52. A protection and filter element 40 constructed in a such a fashion can be used if required to limit voltage peaks occurring at the input 30, or undesirably high frequencies via the resistors 49 and 51 or the RC element, which has the resistor 49 and the capacitor and acts as a low-pass filter.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A combined current and voltage transformer for metal-enclosed, gas-insulated high-voltage switchgear comprising:
    a tubular metal enclosure at ground potential and filled with an insulating gas;
    a current sensor enclosed and supported by said enclosure and containing a shielded Rogowski coil, which after installation in the metal enclosure concentrically surrounds a high-voltage conductor of the switchgear;
    a voltage sensor enclosed and supported by said enclosure and containing a hollow cylindrical test electrode which after installation in the metal enclosure concentrically surrounds the high-voltage conductor of the switchgear and which is part of a capacitive voltage divider containing:
    a high-voltage capacitor formed by the high-voltage conductor and the test electrode;
    a low-voltage capacitor formed by the test electrode and the metal enclosure as well as the shield of the Rogowski coil; and
    an ohmic resistor having a first end electrically connected to the test electrode and having a second end electrically connected to the metal enclosure and the shield of the Rogowski coil for forming signals at the output of the voltage sensor which are proportional to the temporal variation in the high voltage of the high voltage conductor; and
    a signal processing device connected to the current sensor and to the voltage sensor and having at least one integration device on which the output signals of the current sensor and of the voltage sensor act.

2. The current and voltage transformer as claimed in claim 1, wherein a filter element, constructed as a low-pass filter or bandpass filter, and an overvoltage protection are connected in each case between the outputs of the current and voltage sensors and the input of the at least one integration device.

3. The current and voltage transformer as claimed in in claim 2, wherein the low-pass filter or bandpass filter is connected downstream of the ohmic resistor.

4. The current and voltage transformer as claimed in claim 3, wherein the low-pass filter is constructed as an RC element.

5. The current and voltage transformer as claimed in claim 4, wherein a nonlinear resistor is connected in parallel to the capacitor of the RC element.

6. The current and voltage transformer as claimed in claim 1, wherein two integration devices are provided, to a first of which the output signals of the current sensor can be applied, and to a second of which the output signals of the voltage sensor can be applied.

7. The current and voltage transformer as claimed in claim 1, wherein the output signals of the current sensor and of the voltage sensor can be applied to the at least one integration device in a temporally interleaved fashion.

8. The current and voltage transformer as claimed in claim 7, wherein the at least one integration device contains a digital IIR filter.

9. The current and voltage transformer as claimed in claim 1 in which the high-voltage capacitor, the low-voltage capacitor and the ohmic resistor are dimensioned such that above a prescribed threshold frequency the amplitudes of the signals at the output of the voltage sensor are below a prescribed amplitude limiting value.

10. The current and voltage transformer as claimed in claim 9, wherein the threshold frequency is determined by the following relationship:

$f_g = \frac{1}{2}\pi R_1 (C_1 + C_2)$, where $f_g$ signifies the threshold frequency in hertz, $R_1$ signifies the value of the ohmic resistor in ohms, and $C_1$ and $C_2$ signify the values of the high-voltage and low-voltage capacitors in farads.

* * * * *

UNITED STATES PATENT AND TRADEMARK OFFICE
CERTIFICATE OF CORRECTION

PATENT NO. : 5,432,438
DATED : Jul. 11, 1995
INVENTOR(S) : Rudolf Baumgartner et al It is certified that error appears in the above-indentified patent and that said Letters Patent is hereby corrected as shown below:

```
On the title page of the above-identified patent, at
item [73], please correct the name of the Assignee to:
--Asea Brown Boveri Ltd.--.
```

Signed and Sealed this

Tenth Day of October, 1995

Attest:

BRUCE LEHMAN

*Attesting Officer*     *Commissioner of Patents and Trademarks*